United States Patent [19]
Andoh et al.

[11] Patent Number: 5,734,184
[45] Date of Patent: Mar. 31, 1998

[54] DRAM COB BIT LINE AND MOAT ARRANGEMENT

[75] Inventors: Katsuyoshi Andoh, Tokyo; Yoichi Miyai, Ibaraki; Masayuki Moroi, Ibaraki; Katsushi Boku, Ibaraki, all of Japan

[73] Assignee: Texas Instruments Incorporated, Dallas, Tex.

[21] Appl. No.: 770,883

[22] Filed: Dec. 20, 1996

[51] Int. Cl.$^6$ .................... H01L 27/108; H01L 29/76; H01L 29/94; H01L 31/119
[52] U.S. Cl. .................................... 257/309; 257/296
[58] Field of Search .................................. 257/296, 309

[56] References Cited

U.S. PATENT DOCUMENTS 5,140,389  8/1992  Kimura et al. .
5,309,386  5/1994  Yusuki et al. .
5,578,849  11/1996  Tadaki et al. .

OTHER PUBLICATIONS

*IBM Tech Discl.*, "Low Temp. Buried Source Isolation Region . . . ", vol. 30 No. 9 Feb. 1988, pp. 164–168.

*Primary Examiner*—Stephen Meier
*Attorney, Agent, or Firm*—Lawrence J. Bassuk; Richard L. Donaldson

[57] ABSTRACT

A DRAM uses arcuate moats 18 and wavy bit lines 28, 30 for the array of memory cells. A bit line contact 20 occurs at the apex of the moat and storage node contacts 22, 24 occur at the ends of legs 40, 42 extending from the apex. The wavy bit lines have alternating crests 32, 36 and troughs 34, 38. The bit lines are arranged over the moats with the troughs of each bit line overlying and contacting the apexes of each moat and the crests avoiding any moat. The crests and troughs of the bit lines are offset from one another. In a half-pitch pattern, the troughs of one bit line lie adjacent to the crests of the next bit line. The moats are concave between the legs and the angle between the legs is between about 140 and 170 degrees. The angle between the crests and troughs of the bit lines is between about 110 and 160 degrees. In one embodiment, the central portion 70 between the areas surrounding the storage node contacts is about 10% wider than the areas surrounding the storage node contacts.

9 Claims, 1 Drawing Sheet

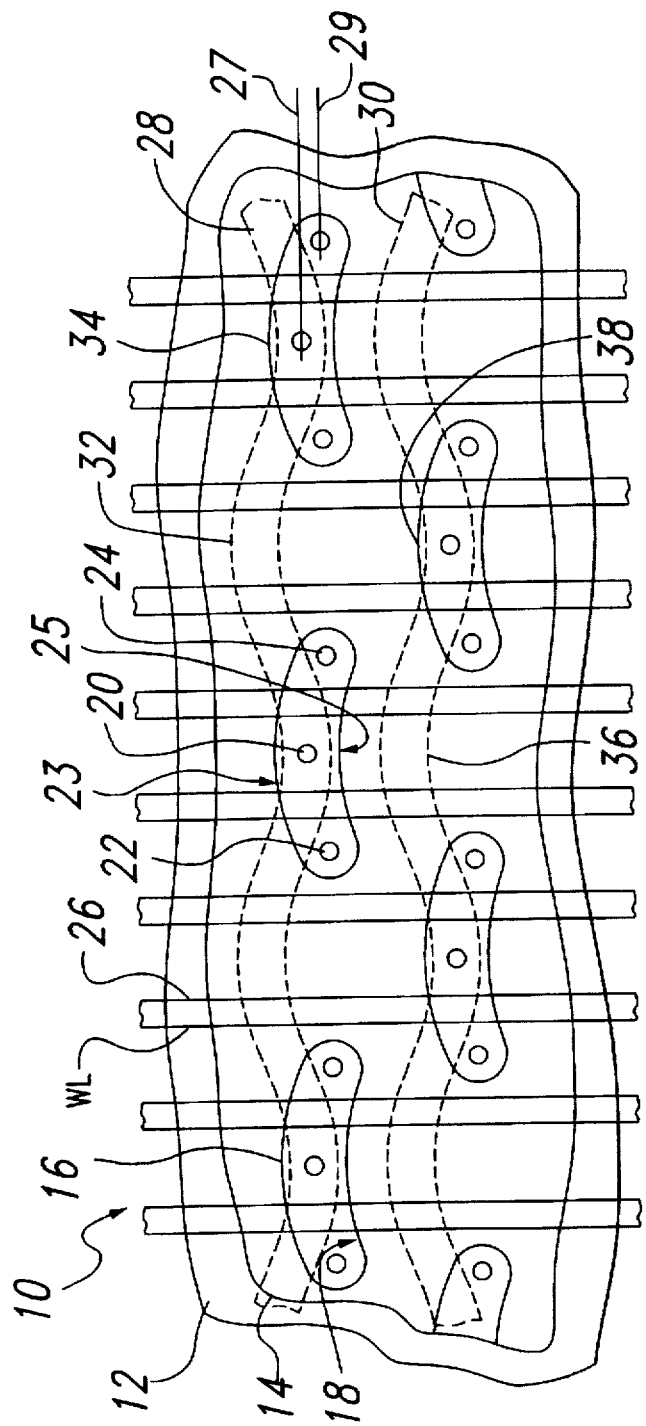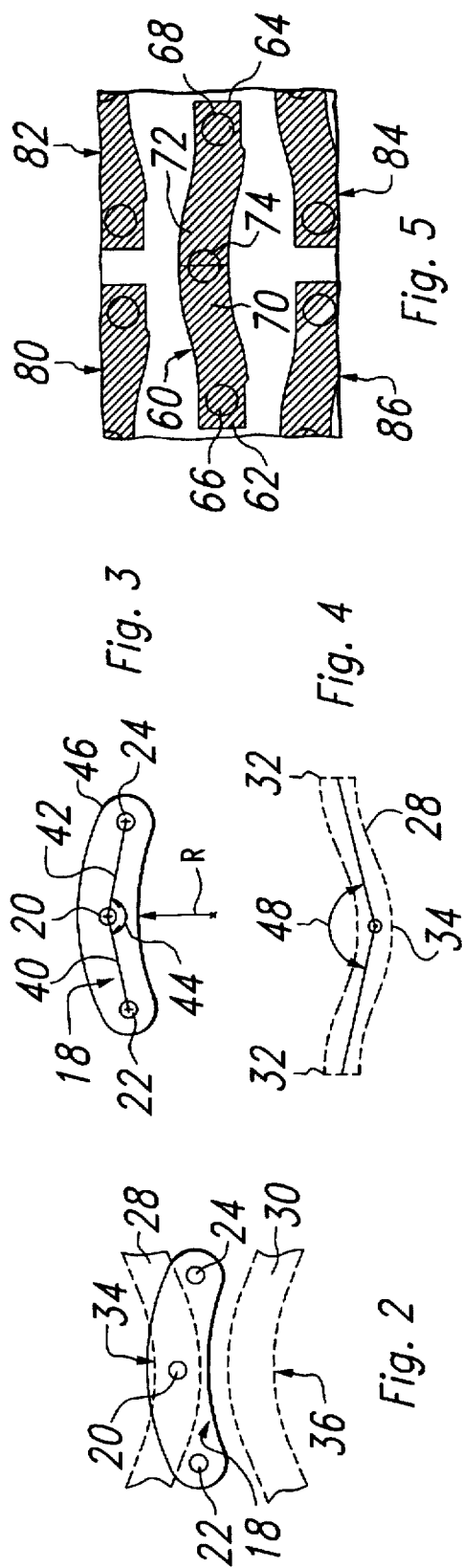

DRAM COB BIT LINE AND MOAT ARRANGEMENT

FIELD OF THE INVENTION

This invention relates generally to semiconductor integrated circuit dynamic random access memory (DRAM) parts having the bit storage capacitors arranged over the bit lines (COB). Particularly, this invention relates to an arcuate arrangement of the moat regions for pairs of memory cells and an arrangement of wavy bit lines to reduce process steps, maintain reliability and increase the density of the memory cells in the array.

DESCRIPTION OF THE RELATED ART

In prior memory cells, the bit storage capacitor occurred under the bit line in what is now called a capacitor under bit line (CUB) memory cell arrangement. In a CUB cell, the moat for each pair of memory cells was rectilinear with a center bit line contact area between two opposed storage node contact areas. The two storage nodes or capacitors occurred just above the moat centered over their respective storage node contact area. A bit line extended across the array of memory cells above the storage nodes and had a descending portion that connected to the centrally located bit line contact area in each moat. In this arrangement, the bit line was generally rectilinear and was aligned directly overlying the two storage node contacts in each moat. This was possible because the capacitors occurred under the bit line. The descending portion of the bit line could use the space between the capacitors or storage nodes to connect to the bit line contact area.

Newer designs seek to increase the capacitance of every storage node capacitor by raising the height of the capacitors centered over the storage node contact areas and using the space between the capacitors. This results in placing the bit line under the capacitors, or the COB memory cell, which raises some new difficulties.

One difficulty is moving the rectilinear alignment of the bit line to the side of the storage node contact areas to avoid the upstanding storage node contact plugs connecting the storage node capacitors to the storage node contacts. Another problem occurs in connecting the side spaced bit line to the bit line contact; this requires a sharp or hard bend in the bit line or a separate connecting pad extending to the bit line contact in the middle of the rectilinear moat. Forming a hard bend incurs resolution problems that make it difficult to get a good shape at the bend. Forming a pad requires additional processing steps.

Another solution would be to bend the moat to move the storage node contact plugs out of alignment with the bit line contact and leave the bit line rectilinear. This incurs problems at the sharp concave curve of the moat; the sharp curve causes undue stress in the LOCOS insulative layer defining the moat.

SUMMARY OF THE INVENTION

The claimed invention uses an arcuate pattern for the moats and uses wavy bit lines that are regular and well resolved during processing to obtain good yields with no increase in stress in the LOCOS insulative layer defining the moats. The claimed invention presents a non-rectilinear pattern for both the moats and the bit lines.

Each moat region is formed in an arcuate shape with an apex and two legs extending from the apex. The bit line contact occurs at the apex and the storage node contacts occur at the ends of the legs. The moat region between the legs is concave and in one embodiment can have a radius R of 3.46 microns. The angle between the legs can be between about 140 and 170 degrees.

The bit lines are formed in a wavy pattern with regularly occurring crests and troughs. Depending on the position of the viewer, the crests can be troughs and the troughs can be crests. The important point is the regular pattern described by the bit lines. The angle at each crest and trough can be between about 110 and 160 degrees.

The troughs of the bit lines are arranged to overlay and contact the moats at the apex or bit line contact of each moat. In one embodiment the crests and troughs of the bit lines are arranged offset from one another at a half-pitch with the crests of one bit line adjacent the troughs of the next bit line.

BRIEF DESCRIPTION OF THE DRAWING FIGURES

FIG. 1 is an idealized plan view of a portion of an array for DRAM memory cells depicting the moats, wordlines and bit lines;

FIG. 2 is an idealized plan view of one moat and two bit lines;

FIG. 3 is an idealized plan view of a moat; and

FIG. 4 is a plan view of part of a bit line; and

FIG. 5 is a plan view of another moat of the invention.

DETAILED DESCRIPTION

In FIG. 1, an idealized array 10 of memory cells comprises a substrate 12 carrying a first insulative layer 14 typically formed in a LOCOS process and patterned to obtain plural arcuate openings 16 through the first insulative layer 14 to the substrate 12. These openings 16 define locations at which pairs of memory cells will be fabricated. Through these openings 16 arcuate moats 18 will be formed in substrate 12.

At each arcuate moat 18 there will be formed a bit line contact 20 and a pair of storage node contacts 22 and 24. Although small circles are used to focus attention and emphasize the contact locations in the moats, in actuality the entire area surrounding each circle will be used for the respective contact. The arcuate shape of each moat 18 results in a convex side 23 and a concave side 25. The moats are arranged in the substrate 12 to align the bit line contacts 20 substantially rectilinearly along a first line 27. The moats are arranged in the substrate 12 also to align the storage node contacts 22 and 24 substantially rectilinearly along a second line 29.

Between each bit line contact 20 and storage node contact 22 or 24, a wordline 26 runs generally perpendicular to the first and second lines 27 and 29. The wordlines 26 are generally rectilinear, although they can include some curvature resulting from reducing the spacing between elements in the array, and two wordlines run across each moat 18. The wordlines 26 are formed on the first insulative layer 14 and, as they pass across the moats, the wordlines form gates of pass transistors separating and electrically isolating the bit line contacts 20 from the storage node contacts 22 and 24. The capacitors used for the storage nodes are not depicted in this drawing to clarify the description of the geometry of the moats and bit lines.

Above the word lines 26, and insulated from the wordlines by another insulative layer, not shown, lie a plurality of bit lines 28 and 30 depicted in dashed line outline. While only two bit lines are depicted, it will be understood that many more bit lines, wordlines and moats can be formed as desired in manufacturing array 10 of memory cells.

Bit lines 28 and 30 are wavy to have regularly occurring crests 32 and 36 and troughs 34 and 38 respectively, viewed from the bottom of the drawing figure. In effect, each bit line is convex and concave at each crest and trough, as viewed from opposite sides of the bit line. The bit lines can have a sinuous or other desired shape. The troughs of bit line 28 pass over and connect to the bit line contacts 20 of its respective moats 18, while the crests of bit line 28 avoid overlying any moat area. The troughs of bit line 30 also pass over and connect to the bit line contacts 20 of its respective moats 18, while the crests of bit line 30 avoid overlying any moat area.

Bit line 28 occurs to the convex side 23 of all the moats to which it connects, and bit line 30 occurs to the convex side 23 of all the moats to which it connects. Arranging the convex features of the moats and bit lines to overlap one another avoids interference between the bit lines and storage node.

Memory cell array 10 exhibits a half pitch pattern in which the crests 36 of bit line 30 are adjacent to the troughs 34 of bit line 28. Other pitches in which the crests and troughs of the bit lines are offset from one another also can be used. An example of this not depicted would be a quarter-pitch pattern.

Also referring to FIG. 2, the crest 36 of bit line 30 lies closely spaced from the moat 18 with the crest 36 closely following the concave arcuate shape of moat 18. This provides for close formation of the bit lines and the moats while keeping them electrically isolated.

In FIG. 3, moat 18 has an arcuate shape with a bit line contact 20 at the apex and the storage node contacts 22 and 24 at the ends of legs 40 and 42. The angle 44 between legs 40 and 42 desirably can be between 140 degrees and 170 degrees. The perimeter 46 of moat 18 follows the angle 44 and provides sufficient area around the contacts 20, 22 and 24 for formation of the contacts. On the concave side of the moat 18, the radius R of the moat between the legs 40 and 42 can be about 3.46 microns.

In FIG. 4, the angle 48 between the crests and troughs of the bit line can be between 110 degrees and 160 degrees.

In FIG. 5, moat 60 has a shape that may be described as "gull winged." the areas 62 and 64 surrounding storage node contacts 66 and 68 are generally rectangular or square. The central portion 70 of moat 60 including the rectangular area 72 surrounding the bit line contact 74 has a wideness slightly greater than areas 62 and 64. This provides for the angle in the moat 60 while achieving adequate space at bit line contact 74 for connecting to a bit line (not shown). In this embodiment, the central portion is about 10% wider than the areas 62 and 64. Moats 80, 82, 84 and 86 are of like construction and arrangement.

The moats thus have smooth curves to avoid stress problems in the LOCOS insulation layer. The bit lines have a wavy shape to avoid intersecting the storage node contact areas and to obtain a regular pattern that can be well resolved and formed during processing.

Some exemplary combinations of corresponding angles, in degrees, for the moats and bit lines are as follows:

| Case | Moat | Bit line |
| --- | --- | --- |
| 1 | 160 | 140 |
| 2 | 153 | 153 |
| 3 | 170 | 130 |
| 4 | 170 | 140 |
| 5 | 156 | 142 |
| 6 | 145 | 153 |
| 7 | 153 | 153 |

As can be seen from this combination of angles, the larger angles of the moat generally pair with the smaller angles of the bit line.

The present estimate of the best combination of angles forms the bit line at about 140 degrees and the moat at about 160 to 170 degrees.

The invention can be practiced other than as specifically described. For example, the bit lines and moats may be scaled as desired to obtain memory cell arrays of desired magnitude.

We claim:

1. A semiconductor integrated circuit DRAM, comprising:

A. a substrate of semiconductor material having a top surface;

B. a first insulative material formed on the top surface of the substrate to form a plurality of openings to the top surface of the substrate, each opening being arcuate and described by an apex and two legs extending from the apex and terminating at ends, each opening locating a moat in the substrate for a pair of memory cells with a bit line contact to the memory cells occurring at the apex and storage node contacts to storage nodes of the memory cells occurring at the ends of the legs; and C. a layer of conductive material formed above the top surface of the substrate to form plural bit lines, the bit lines being wavy with alternating crests and troughs and the bit lines being arranged relative to the moats so that each trough of a bit line overlies an apex of a moat for connecting the bit line to the moat while the ends of the legs lie uncovered by the bit lines.

2. The integrated circuit of claim 1 in which the moats and bit lines are arranged in a half-pitch pattern with the troughs of one bit line adjacent the crests of the next bit line.

3. The integrated circuit of claim 1 in which the bit lines are in a pattern with the crests and troughs of one bit line offset from the crests and troughs of the next bit line.

4. The integrated circuit of claim 1 in which the angle between the legs of the moat is between about 140 and 170 degrees and the moat between the legs is concave with a radius of R of about 3.5 microns.

5. The integrated circuit of claim 1 in which each crest and trough of a bit line is at an angle between about 110 and 160 degrees.

6. The integrated circuit of claim 1 in which each moat has a convex side and a concave side, the apexes of the moats being arranged substantially rectilinearly in plural lines with all concave sides to one side of the lines and each bit line being arranged on the convex sides of the moats to which it connects.

7. The integrated circuit of claim 1 in which each crest and trough of a bit line is at an angle of about 140 degrees and the angle between the legs of each moat is between about 160 and 170 degrees.

8. The integrated circuit of claim 1 in which each moat has a central portion between the ends of the legs at the storage node contacts and the central portion is wider than the areas of the moat surrounding the storage node contacts.

9. The integrated circuit of claim 7 in which the central portion is about 10% wider than the areas of the moat surrounding the storage node contacts.

* * * * *